(12) United States Patent
Wang et al.

(10) Patent No.: US 7,589,969 B2
(45) Date of Patent: Sep. 15, 2009

(54) FOLDING PROTECTIVE COVER FOR HEAT-CONDUCTIVE MEDIUM

(75) Inventors: Feng-Ku Wang, Taipei (TW); Yi-Lun Cheng, Taipei (TW); Chun-Yi Chang, Taipei (TW); Jui-Chan Fan, Taipei (TW); Chun-Lung Lin, Taipei (TW); Chih-Kai Yang, Taipei (TW)

(73) Assignee: Inventec Corporation, Taipei (TW)

( * ) Notice: Subject to any disclaimer, the term of this patent is extended or adjusted under 35 U.S.C. 154(b) by 766 days.

(21) Appl. No.: 11/401,875

(22) Filed: Apr. 12, 2006

(65) Prior Publication Data

US 2007/0243345 A1    Oct. 18, 2007

(51) Int. Cl.
*H05K 7/20* (2006.01)

(52) U.S. Cl. .................. 361/705; 361/704; 361/708; 165/80.3; 165/185; 257/707

(58) Field of Classification Search .................. None
See application file for complete search history.

(56) References Cited

U.S. PATENT DOCUMENTS 5,897,917 A    4/1999    Hinshaw et al.
6,029,740 A *  2/2000    Lee et al. .................. 165/76
6,049,458 A    4/2000    Lee et al.
7,319,592 B2 * 1/2008    Wang et al. ................ 361/705
7,365,983 B2 * 4/2008    Huang et al. ............... 361/704
7,441,593 B2 * 10/2008   Wu ........................... 165/185

* cited by examiner

*Primary Examiner*—Jayprakash N Gandhi
*Assistant Examiner*—Courtney Smith
(74) *Attorney, Agent, or Firm*—Rabin & Berdo, P.C.

(57) ABSTRACT

A folding protective cover structure is used to cover and protect a heat-conductive medium disposed on the bottom surface of a heat sink device. An unfoldable plate body is employed and has a hollow portion, a folding portion, and an adhesive area; wherein the hollow portion is used for surrounding the heat-conductive medium with a frame-fixing plate extending from its edge, which is folded towards an opposite direction of the heat-conductive medium, so as to keep an upright state; the folding portion is folded towards the hollow portion, so that the frame-fixing plate passes through the folding portion to clip and fix the folding portion, thus forming an accommodating space for protecting the heat-conductive medium; and the adhesive area is located at the edge of the hollow portion, facing the surface of the heat sink device, for adhering and securing the plate body to the heat sink device.

9 Claims, 7 Drawing Sheets

FOLDING PROTECTIVE COVER FOR HEAT-CONDUCTIVE MEDIUM

BACKGROUND OF THE INVENTION

1. Field of Invention

The invention relates to a structural design of a folding protective cover for a heat-conductive medium, and more particularly, to a folding protective cover for a heat-conductive medium suitable for a heat sink device.

2. Related Art

Electronic elements in the computer apparatus, such as central processing unit (CPU) chips and power integrated circuits (IC), etc., generate heat when carrying out operations. The watt consumption of CPU chips has become higher and higher, and the high integrity of ICs also centralizes the heat source, such that not only does intense heat occur during the operation, but the resulting heat increases as the operation speed increases. Since the operation temperature has severe impact on whether the computer apparatus will crash or not, appropriate temperature control will provide the computer apparatus with high reliability and allow the heat-emitting electronic elements to operate stably.

In order to reduce the working temperature of the heat-emitting electronic elements while maintaining the effective operation, various heat sink devices are designed through the heat sinking design. The heat resistance of the surface can be reduced by closely contacting the heat sink device with the heat-emitting electronic element, and the heat-conductive effect between the heat sink device and the heat-emitting electronic element can be enhanced by coating a heat-conductive medium there-between.

As for manufacturers of heat sink devices, a heat-conductive medium is generally arranged on a heat sink device in advance, to facilitate the later stage assembling and processing for the customer. However, during the transportation of heat sink devices, it is rather easy for the heat-conductive medium to pollute the ambience, or to be scraped and squeezed by the surrounding objects. Thus, the heat-conductive medium must be sufficiently protected while transporting heat sink devices.

U.S. Pat. No. 5,897,917 discloses a method for applying a protective membrane directly onto the bottom surface of a heat sink device provided with a heat-conductive medium, to protect the heat-conductive medium. Although this method can prevent the heat-conductive medium from being polluted by the ambience and vice versa, the protective membrane directly contacted with the heat-conductive medium is likely to be squeezed to be deformed or scraped by ambient external forces during the transportation of the heat sink device.

U.S. Pat. No. 6,049,458 discloses a protective cover body for a heat-conductive medium, wherein the central part of the cover body corresponds to a heat sink device with a heat-conductive medium, while the edge of the cover body is adhered and secured to the bottom surface of the heat sink device. Although deforming and scraping of the heat-conductive medium due to squeezing can be reduced in this way, the protective cover body tends to be spatially restrained during transportation and stocking due to its large size and volume, thus affecting the dimensions of the material and thereby resulting in extra burden to transportation operations.

SUMMARY OF THE INVENTION

In the above conventional art, without fully considering scraping and deforming of the heat-conductive medium due to exterior squeezing during transportation, the heat-transferring effect is reduced after the protective membrane has been arranged on the heat sink device, and the surface of the heat sink device is also damaged, resulting in wearing off of the heat sink device. Besides, the protective cover body for a heat-conductive medium has a large volume and relatively large dimensions, such that the burden for the transportation operation is increased. Accordingly, a structural design of a folding protective cover for a heat-conductive medium is provided in the invention, which is suitable for heat sink devices.

A folding protective cover structure for a heat-conductive medium disclosed in the invention is used to cover and protect the heat-conductive medium disposed on the bottom surface of the heat sink device. The folding protective cover for a heat-conductive medium is an unfoldable plate, which has a hollow portion, a folding portion, and an adhesive area. The hollow portion used for surrounding the heat-conductive medium on the heat sink device has a frame-fixing plate extending from its edge, which is folded towards an opposite direction to the heat-conductive medium, so that the frame-fixing plate maintains an upright state relative to the plate body. The folding portion is provided with a positioning slot corresponding to the frame-fixing plate. The folding portion is folded towards the hollow portion, such that the frame-fixing plate can pass through the positioning slot while keeping the upright position, to clip and fix the folding portion, thus the plate body forms an accommodating space with the frame-fixing plate for protecting the heat-conductive medium. The adhesive area, located at the edge of the hollow portion, facing the surface of the heat sink device, can be used to adhere the plate body to the heat sink device.

The folding protective cover structure for a heat-conductive medium disclosed in the invention can be used to protect the heat-conductive medium from being damaged while the heat sink device is transported to a third place to be assembled, so as to ensure the heat sink effect of the heat sink device. In addition, with the frame-fixing plate of the plate body passing through the positioning slot, the protective cover can clip the heat-conductive medium through self-assembly with convenient operation. Meanwhile, the cost for manufacturing the protective cover is not excessively high, and it is convenient for transportation since the dimensions are reduced.

To further understand the above and other objects, features, and advantages of this invention, it will be illustrated below in detail through the specific embodiments with reference to the accompanying drawings.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

As for the folding protective cover structure for a heat-conductive medium disclosed in the invention, the so-called heat-conductive medium is applied to, but not limited to, a heat sink fin for heat dissipation. Rather, the technique disclosed in the invention also can be used to provide a conductive heat sink interface for the heat-emitting electronic elements. In the detailed description of the invention below, a heat sink fin is taken as an embodiment of the invention.

Figure 1:
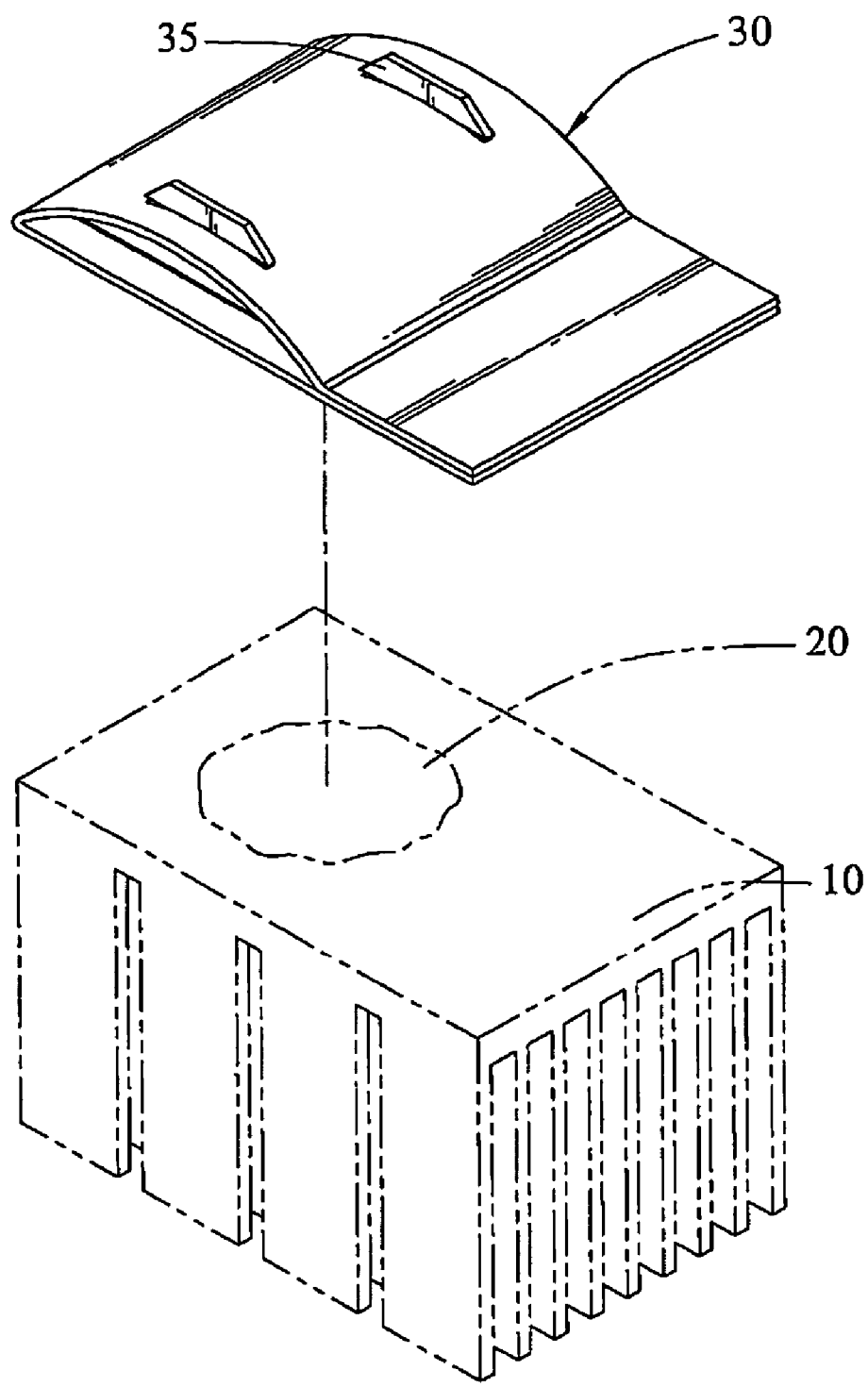
FIG. 1 is an exploded stereogram of a folding protective cover for a heat-conductive medium in the using state.
Figure 2:
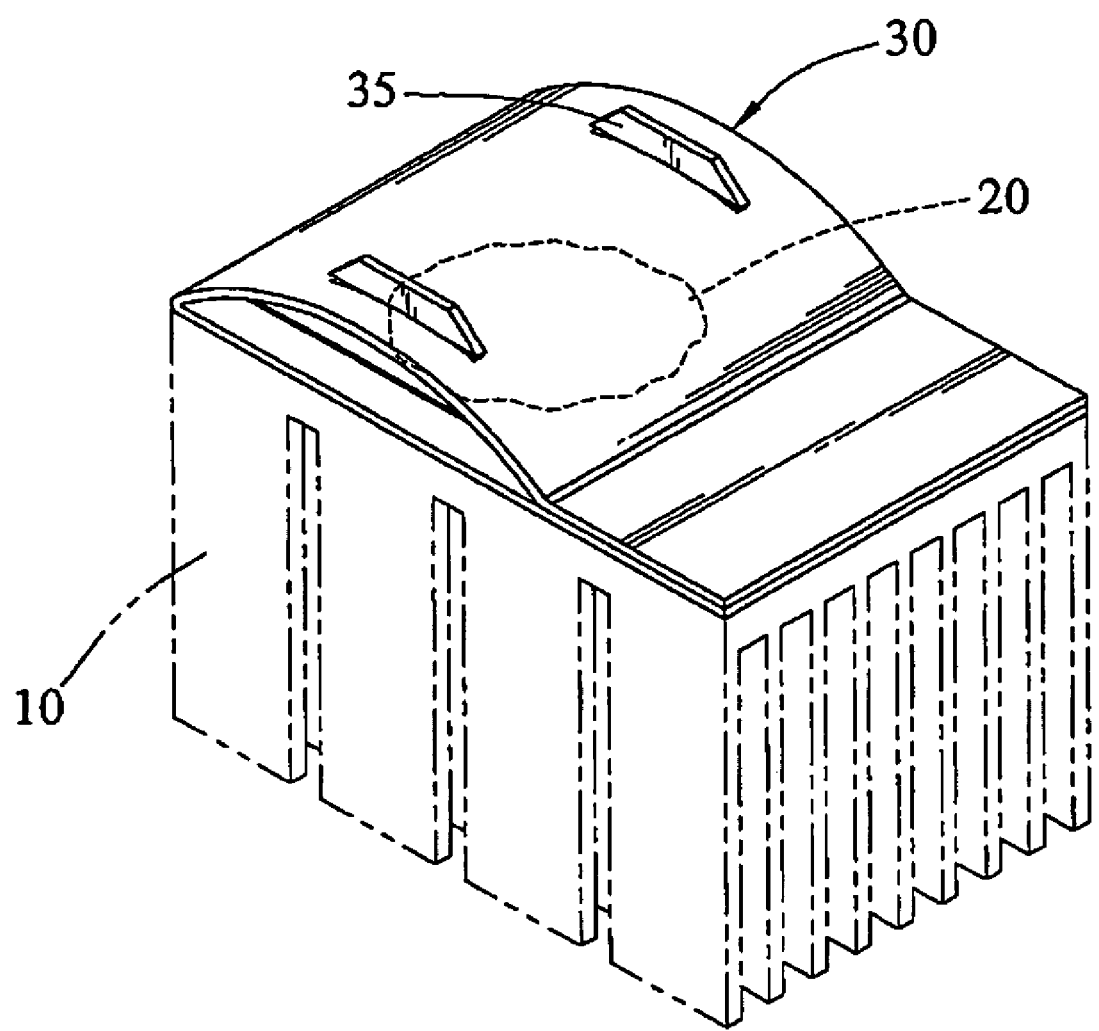
FIG. 2 is a combined stereogram of a folding protective cover for a heat-conductive medium in the using state.

Referring to FIGS. 1 and 2, a heat sink fin 10 is provided with a heat conductive medium 20 at the bottom surface, and a protective cover for the heat conductive medium 30 is disposed on the heat conductive medium 20 for protecting the heat conductive medium 20, as shown in the figures.

Figure 3:
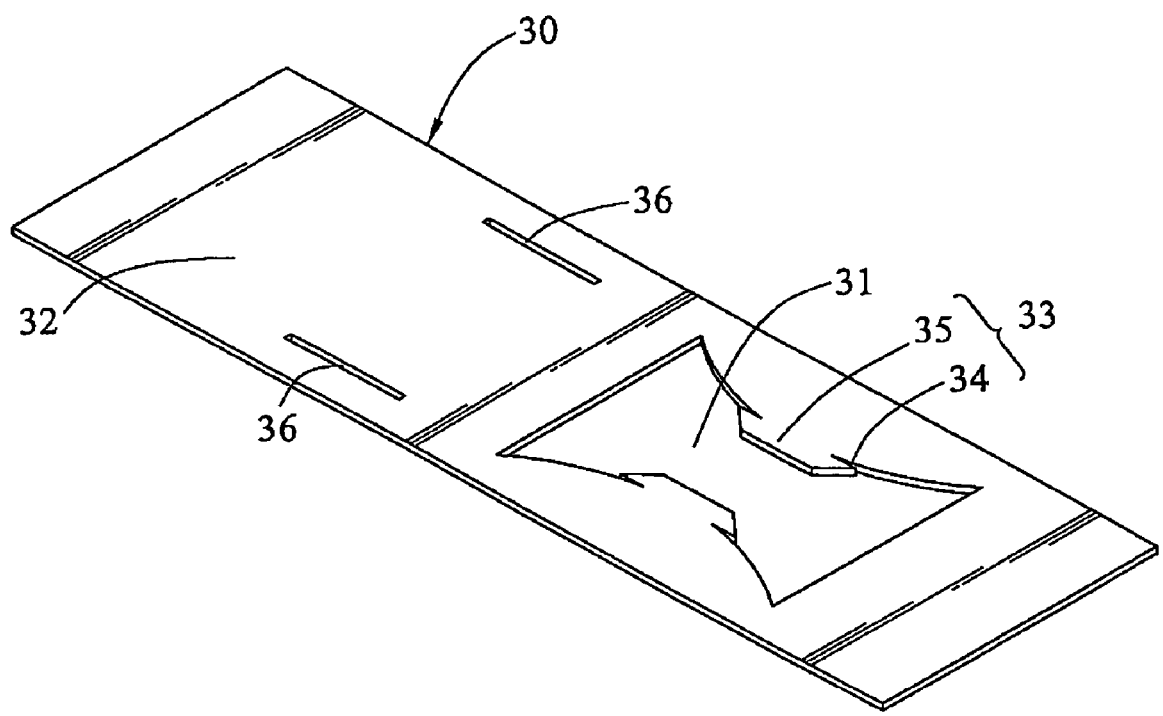
FIG. 3 is an unfolded plan view of a folding protective cover for a heat-conductive medium.

Referring to FIG. 3, it is an unfolded plan view of the protective cover for a heat-conductive medium 30, which has a hollow portion 31 and a folding portion 32. A frame-fixing plate 33 extending from the edge of the hollow portion 31 has a protrusion portion 35 with clipping grooves 34 relatively extending there-from. And the folding portion 32 is provided with positioning slots 36 corresponding to the frame-fixing plates 33.

Figure 4:
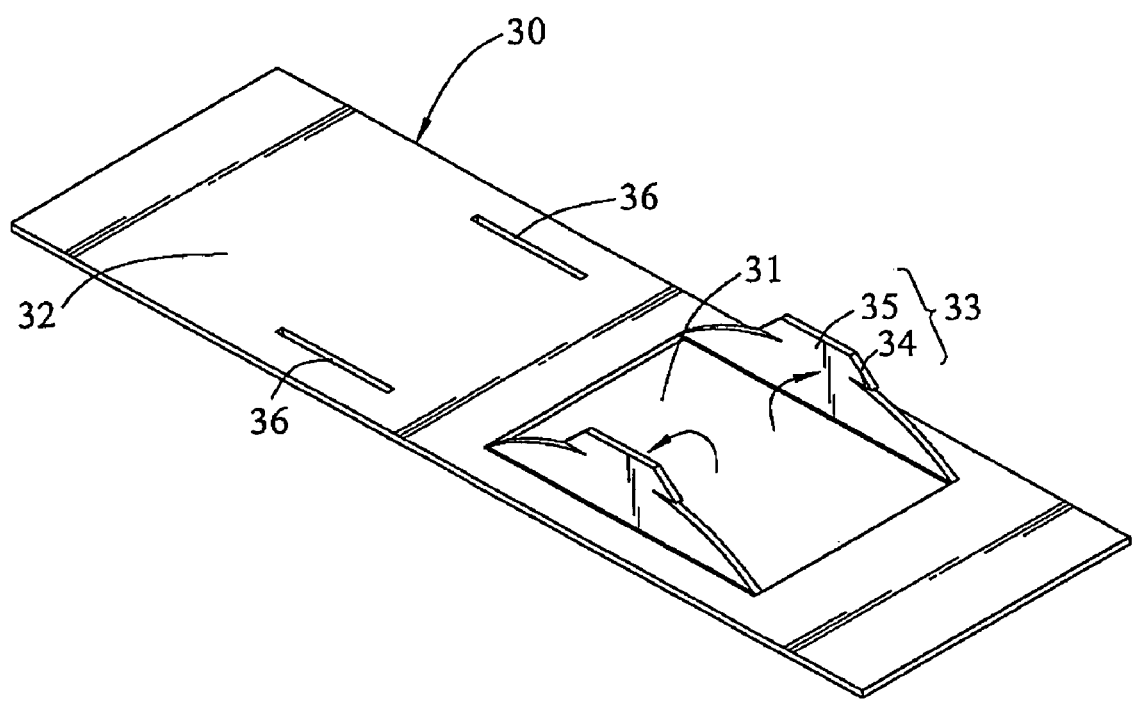
FIG. 4 is a first combined stereogram of a folding protective cover for a heat-conductive medium.
Figure 5:
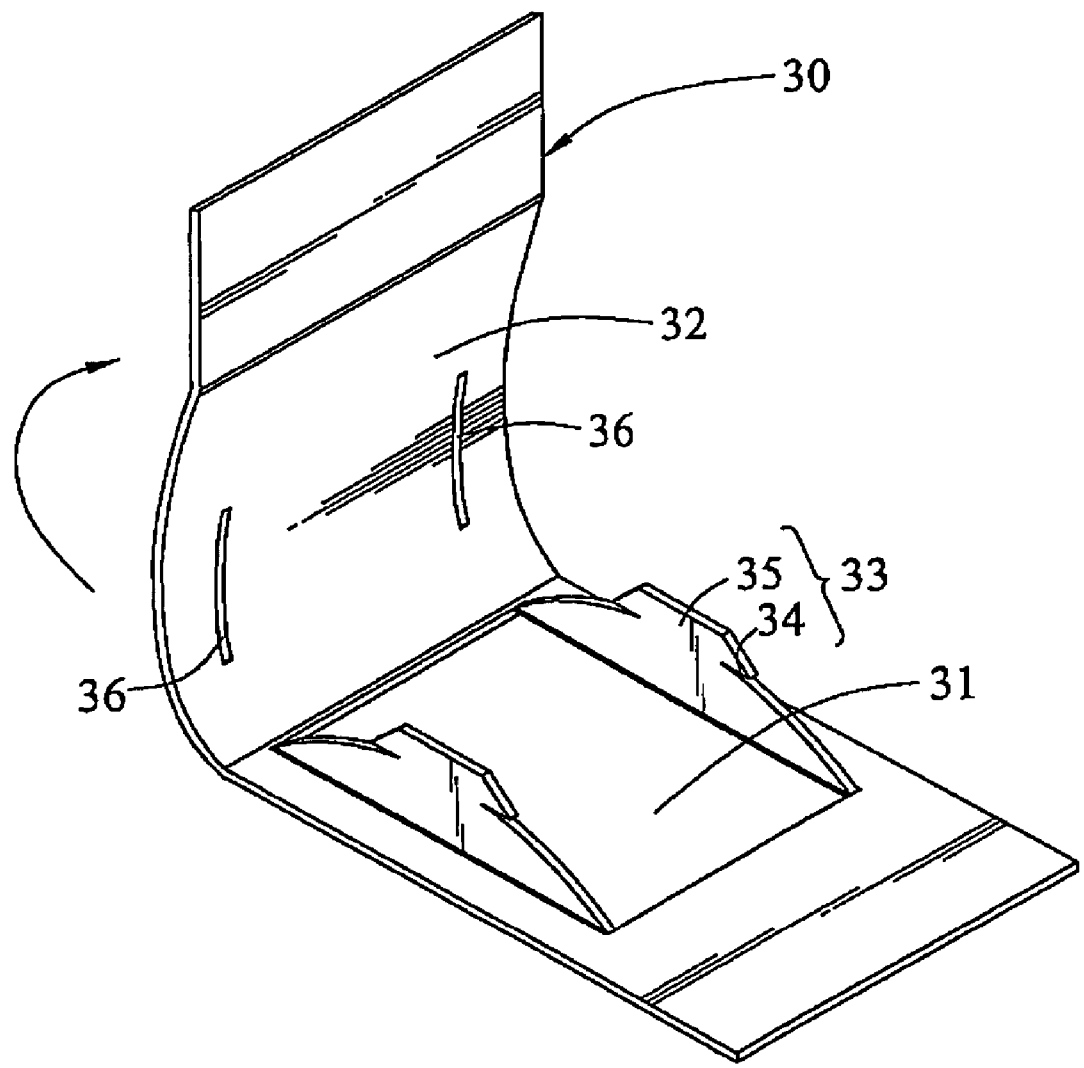
FIG. 5 is a second combined stereogram of a folding protective cover for a heat-conductive medium.
Figure 6:
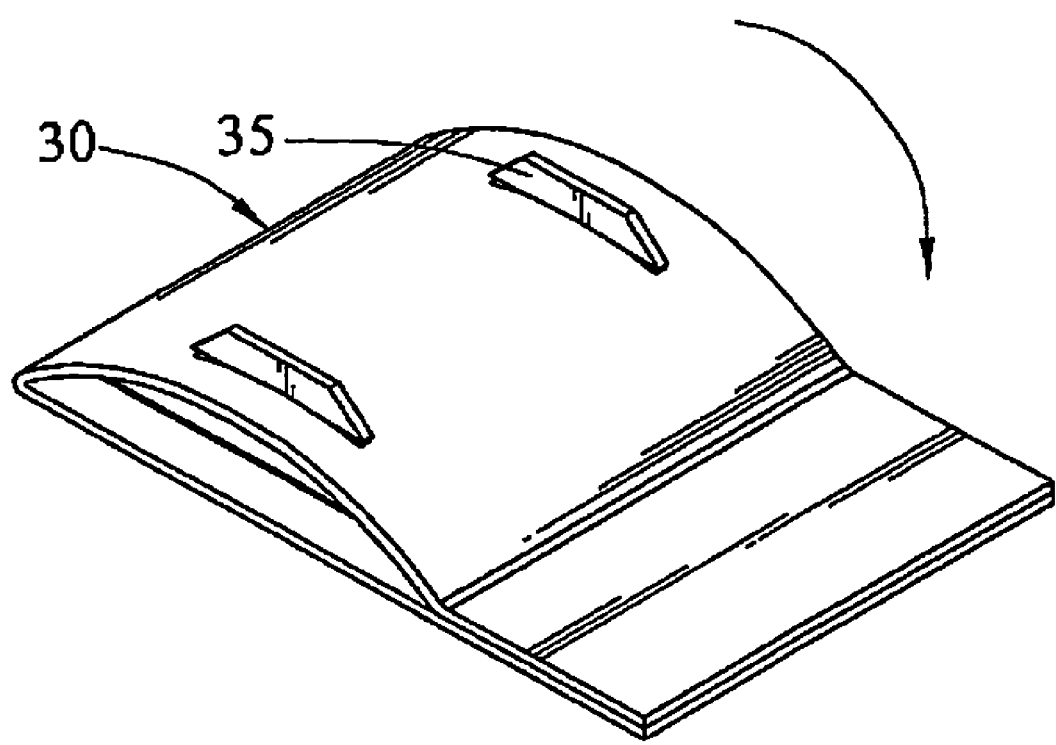
FIG. 6 is a third combined stereogram of a folding protective cover for a heat-conductive medium.
Figure 7:
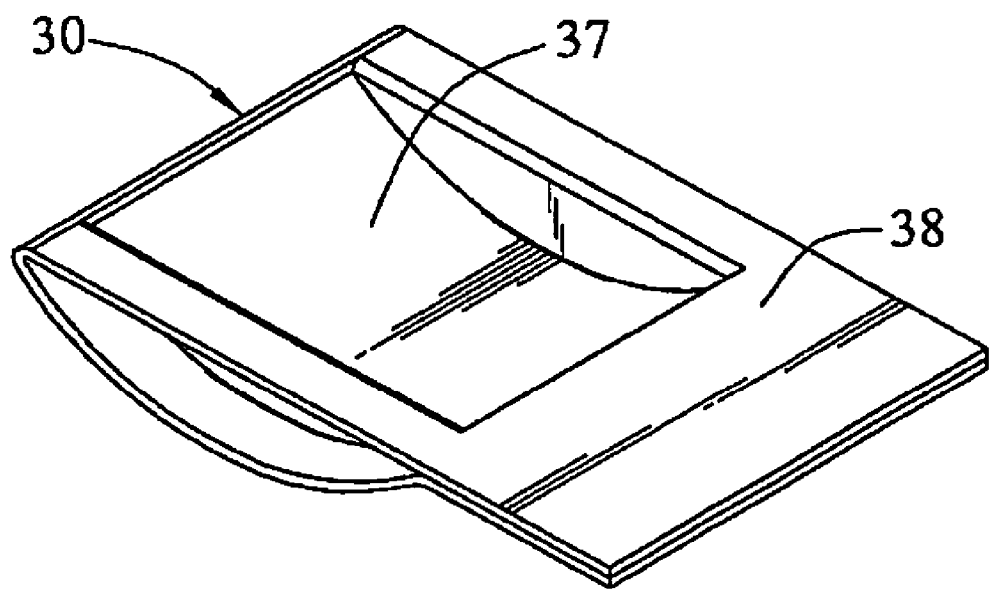
FIG. 7 is a schematic view of the rear surface of a folding protective cover for a heat-conductive medium.

Referring to FIGS. 4, 5, 6, and 7, the frame-fixing plate 33 is folded towards an opposite direction of the heat conductive medium 20, such that the frame-fixing plate 33 keeps an upright state relative to the protective cover for a heat conductive medium 30, being aligned with the positioning slot 36, as shown in FIG. 4. By folding the folding portion 32 towards the hollow portion 31, the positioning slot 36 is also folded and directed close to the frame-fixing plate 33 while still being aligned with the frame-fixing plate 33, as shown in FIG. 5. After the protrusion portion 35 of the frame-fixing plate 33 has passed through the positioning slot 36, the positioning slot 36 is then clipped and fixed by the clipping groove 34, such that the protrusion portion 35 protrudes from the plate body 30, as shown in FIG. 6. The frame-fixing plate 33 is completely positioned and assembled with the positioning slot 36, to form an accommodating space 37. A double-sided glue or any other adhesive is applied to the adhesive area 38, for adhering the protective cover for a heat conductive medium 30 onto the heat sink fin 10, as shown in FIG. 7.

The above disclosure is only an embodiment of the invention, and is not intended to limit the application scope of the invention. Equivalent variations and modifications made to the embodiment, without departing from the spirit and scope of the invention all fall into the protection scope of the invention. For example, in the folding protective cover structure for a heat-conductive medium disclosed in the invention, the frame-fixing plate is extended from the edge of the folding protective cover for a heat-conductive medium; and alternatively, after the frame-fixing plate has passed through the positioning slot, the protrusion portion on the frame-fixing plate protrudes from the plate body, such that the protrusion portion can be folded down towards the heat-conductive medium, for clipping and fixing the positioning slot.

What is claimed is:

1. A folding protective cover body structure for a heat-conductive medium in a heat sink device, for covering and protecting the heat-conductive medium disposed on the bottom surface of the base for the heat sink device, the protective cover body for the heat-conductive medium comprising:

a plate body, including a hollow portion, a folding portion, and an adhesive area, wherein the hollow portion is used for surrounding the heat-conductive medium, with a frame-fixing plate extending from the edge of the hollow portion, which is folded towards an opposite direction of the heat-conductive medium so as to keep an upright state relative to the plate body; the folding portion is provided with a positioning slot corresponding to the frame-fixing plate, and by folding the folding portion towards the hollow portion, the frame-fixing plate passes through the positioning slot while keeping the upright position, so as to clip and fix the folding portion, thus forming an accommodating space for protecting the heat-conductive medium; and the adhesive area is located at the edge of the hollow portion, facing the surface of the heat sink device, for adhering the plate body onto the heat sink device.

2. The protective cover body for a heat-conductive medium according to claim 1, wherein the plate body has any geometric shape selected from a group consisting of circle, triangle, and trapezium.

3. The protective cover body for a heat-conductive medium according to claim 1, wherein the plate body is made of any moldable material, selected from any one of a group consisting of paper sheet, plastic sheet, and metal sheet.

4. The protective cover body for a heat-conductive medium according to claim 1, wherein the area of the hollow portion is no less than that of the heat-conductive medium.

5. The protective cover body for a heat-conductive medium according to claim 1, wherein the frame-fixing plate has a protrusion portion extending there-from, for passing through the positioning slot and then being folded downward, so as to approach and position the folding portion.

6. The protective cover body for a heat-conductive medium according to claim 1, wherein the frame-fixing plate has a protrusion portion extending there-from and the protrusion portion has a clipping groove used for clipping the positioning slot and positioning the folding portion after the protrusion portion has passed through the positioning slot.

7. The protective cover body for a heat-conductive medium according to claim 1, wherein there is a height difference between the frame-fixing plate and the plate body, when the frame-fixing plate keeps the upright state.

8. The protective cover body for a heat-conductive medium according to claim 1, wherein the accommodating space is formed by covering the upper portion of the heat-conductive medium with the plate body and covering the side portions of the heat-conductive medium with the frame-fixing plates.

9. The protective cover body for a heat-conductive medium according to claim 1, wherein the adhesive area is provided with a double-sided glue or an adhesive.

* * * * *

UNITED STATES PATENT AND TRADEMARK OFFICE
CERTIFICATE OF CORRECTION

PATENT NO. : 7,589,969 B2  Page 1 of 1
APPLICATION NO. : 11/401875
DATED : September 15, 2009
INVENTOR(S) : Wang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 826 days.

Signed and Sealed this

Twenty-first Day of September, 2010

David J. Kappos
*Director of the United States Patent and Trademark Office*